United States Patent
Jia et al.

(10) Patent No.: US 11,417,397 B2
(45) Date of Patent: Aug. 16, 2022

(54) NON-VOLATILE MEMORY DEVICE AND CONTROL METHOD FOR MITIGATING MEMORY CELL OVERWRITTEN

(71) Applicant: Yangtze Memory Technologies Co., Ltd., Wuhan (CN)

(72) Inventors: Jianquan Jia, Wuhan (CN); Kun Fan, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/988,729

(22) Filed: Aug. 10, 2020

(65) Prior Publication Data
US 2021/0350854 A1    Nov. 11, 2021

Related U.S. Application Data

(63) Continuation of application No. PCT/CN2020/088654, filed on May 6, 2020.

(51) Int. Cl.
*G11C 16/04*    (2006.01)
*G11C 16/10*    (2006.01)

(52) U.S. Cl.
CPC .......... *G11C 16/10* (2013.01); *G11C 16/0483* (2013.01)

(58) Field of Classification Search
CPC .............................. G11C 16/10; G11C 16/0483
USPC .................................................... 365/185.17
See application file for complete search history.

(56) References Cited

U.S. PATENT DOCUMENTS

| | | | |
|---|---|---|---|
| 6,807,101 B2 | 10/2004 | Ooishi | |
| 7,436,709 B2 * | 10/2008 | Higashitani | G11C 16/0483 365/185.23 |
| 8,130,556 B2 * | 3/2012 | Lutze | G11C 16/10 365/230.01 |
| 8,331,148 B2 * | 12/2012 | Shibata | G11C 11/5642 365/185.17 |
| 8,681,544 B2 * | 3/2014 | Lee | G11C 11/5628 365/185.03 |
| 8,804,426 B2 | 8/2014 | Aritome | |
| 9,620,221 B1 | 4/2017 | Son | |
| 9,653,168 B2 * | 5/2017 | Kim | G11C 16/10 |
| 2005/0226055 A1 * | 10/2005 | Guterman | G11C 16/12 365/185.28 |

(Continued)

FOREIGN PATENT DOCUMENTS

| | | |
|---|---|---|
| CN | 1492446 A | 4/2004 |
| CN | 102237137 A | 11/2011 |

(Continued)

*Primary Examiner* — Tha-O H Bui
(74) *Attorney, Agent, or Firm* — Winston Hsu

(57) ABSTRACT

A control method of a non-volatile memory device is provided. The non-volatile memory device includes a memory array including a plurality of memory strings. Each memory string includes a plurality of memory cells connected in series. The control method includes applying a pass voltage signal to a plurality of unselected word lines connected to unselected memory cells of the plurality of memory cells during a programming operation period; and applying a program voltage signal to a selected word line connected to a selected memory cell of the plurality of memory cells during the programming operation period, wherein the program voltage signal is decreasing or changes in a descending step pulse manner during the programming operation period.

6 Claims, 5 Drawing Sheets

(56) References Cited

U.S. PATENT DOCUMENTS

| | | | |
|---|---|---|---|
| 2007/0297247 A1* | 12/2007 | Hemink | G11C 11/5628 |
| | | | 365/185.33 |
| 2013/0176794 A1 | 7/2013 | Lee | |
| 2020/0020402 A1 | 1/2020 | Lee | |

FOREIGN PATENT DOCUMENTS

| CN | 102682843 A | 9/2012 |
|---|---|---|
| CN | 109658964 A | 4/2019 |

* cited by examiner

NON-VOLATILE MEMORY DEVICE AND CONTROL METHOD FOR MITIGATING MEMORY CELL OVERWRITTEN

CROSS REFERENCE TO RELATED APPLICATIONS

This application is a continuation of PCT Application No. PCT/CN2020/088654, filed on May 6, 2020, the entire contents of which are incorporated herein by reference.

BACKGROUND OF THE INVENTION

1. Field of the Invention

The present invention is related to a non-volatile memory device and a control method, and more particularly to a non-volatile memory device and a control method capable of mitigating the overwritten effect of the near end memory cells.

2. Description of the Prior Art

Non-volatile memory devices, such as flash memory, have become the storage of choice in various electrical products, such as personal computers, flash drives, digital cameras, and mobile phones. Flash memory devices have undergone rapid development. The flash memory can store data for a considerably long time without powering, and have advantages such as high integration level, fast access, easy erasing, and rewriting. To further improve the bit density and reduce cost of the flash memory device, a three-dimensional (3D) NAND flash memory has been developed. A 3D NAND memory architecture stacks memory cells vertically in multiple layers, achieving a higher density than traditional NAND memory. As more layers are added, the bit density increases, thus increasing more storage capacity. But, the increase in the number of layers makes the etching process become more difficult. Therefore, a main trend in the efforts to develop 3D NAND flash memory is to increase the number of bits stored per cell of each single memory layer in order to improve the bit density of the memory cell. Accordingly, the control gate length (Lg) of the memory cells and spacing (Ls) between separate lines of memory cells can be shortened. As the control gate length and spacing of the memory cells are shortened, the gate resistance and capacitance become larger, thus resulting in propagation delay and latency for near end memory cells of the word line. A word line over-driving method may be used for reducing the propagation delay and latency, and accelerating the programming speed for the near end memory cells. However, the overwritten of the near end memory cells may cause wide cell threshold voltage distribution. Further, the fast programming speed of the near end memory cells may also lead to poor program uniformity. Thus, there is a need for improvement.

SUMMARY OF THE INVENTION

It is therefore an objective of the present invention to provide a non-volatile memory device and a control method capable of capable of mitigating the overwritten effect of the near end memory cells.

An embodiment provides a control method of non-volatile memory device. The non-volatile memory device includes a memory array including a plurality of memory strings and each memory string includes a plurality of memory cells connected in series. The control method includes applying a pass voltage signal to a plurality of unselected word lines connected to unselected memory cells of the plurality of memory cells during a programming operation period; and applying a program voltage signal to a selected word line connected to a selected memory cell of the plurality of memory cells during the programming operation period, wherein the program voltage signal is decreasing or changes in a descending step pulse manner during the programming operation period.

An embodiment provides a non-volatile memory device. The non-volatile memory device includes a memory array comprising a plurality of memory strings, each memory string comprising a plurality of memory cells connected in series; a plurality of word lines connected to the plurality of memory cells of the each memory string of the plurality of memory strings, each word line connected to a respective memory cell; and a control circuit configured to apply a pass voltage signal to unselected word lines of the plurality of word lines connected to unselected memory cells of the plurality of memory cells during a programming operation period and apply a program voltage signal to a selected word line of the plurality of word lines connected to a selected memory cell of the plurality of memory cells during the programming operation period, wherein the program voltage signal is decreasing or changes in a descending step pulse manner during the programming operation period.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, hardware manufacturers may refer to a component by different names. This document does not intend to distinguish between components that differ in name but not function. In the following description and in the claims, the terms "include" and "comprise" are utilized in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
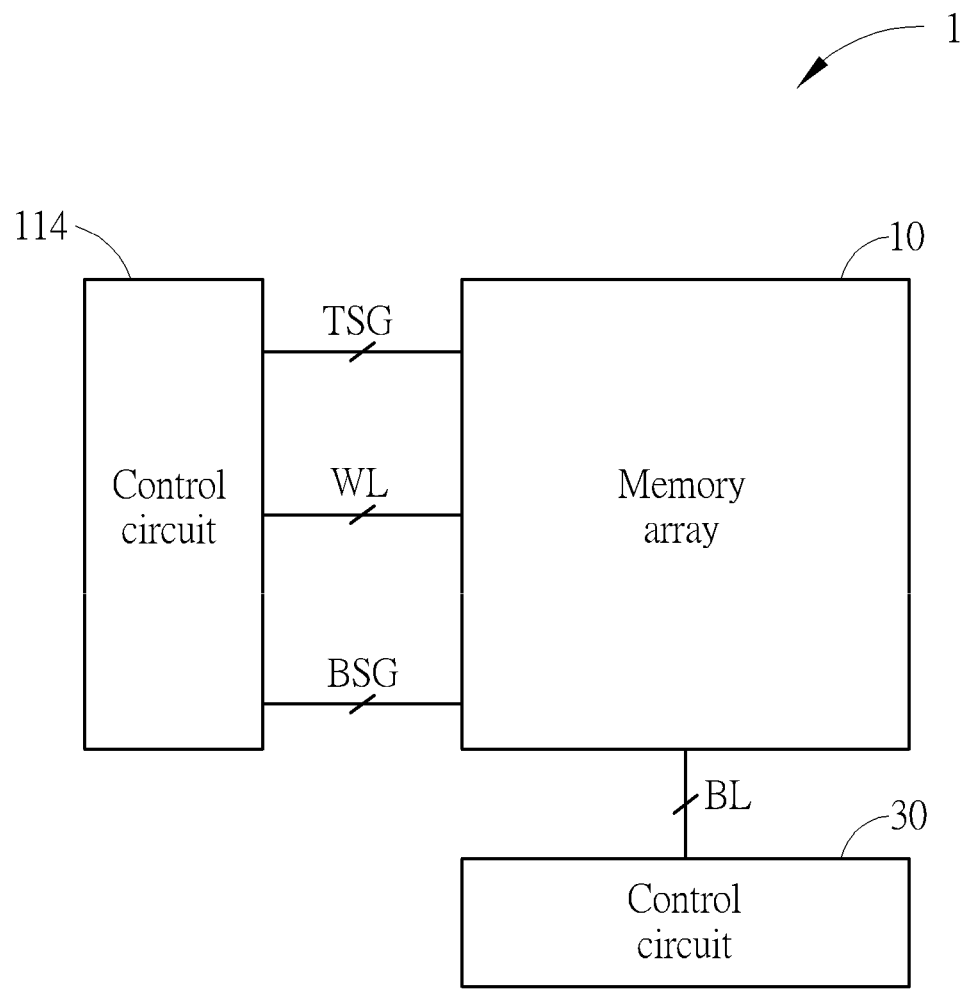
FIG. 1 is a schematic diagram of a non-volatile memory device according to an embodiment of the present invention.

Please refer to FIG. 1, which is a schematic diagram of a non-volatile memory device 1 according to an embodiment of the present invention. The non-volatile memory device 1 may be an NAND flash memory. For example, the non-volatile memory device 1 may be a three-dimensional (3D) NAND flash memory. The non-volatile memory device 1 includes a memory array 10 and control circuits 20 and 30. The memory array 10 includes a plurality of memory strings. Each memory string includes a plurality of memory cells. The memory cells of each string are connected together in series. The intersection of a word line and a semiconductor channel forms a memory cell. Top select gate lines TSG, word lines WL, and bottom gate lines BSG are connected between the memory array 10 and the control circuit 20. Bit lines BL are connected between the memory array 10 and the control circuit 30.

Figure 2:
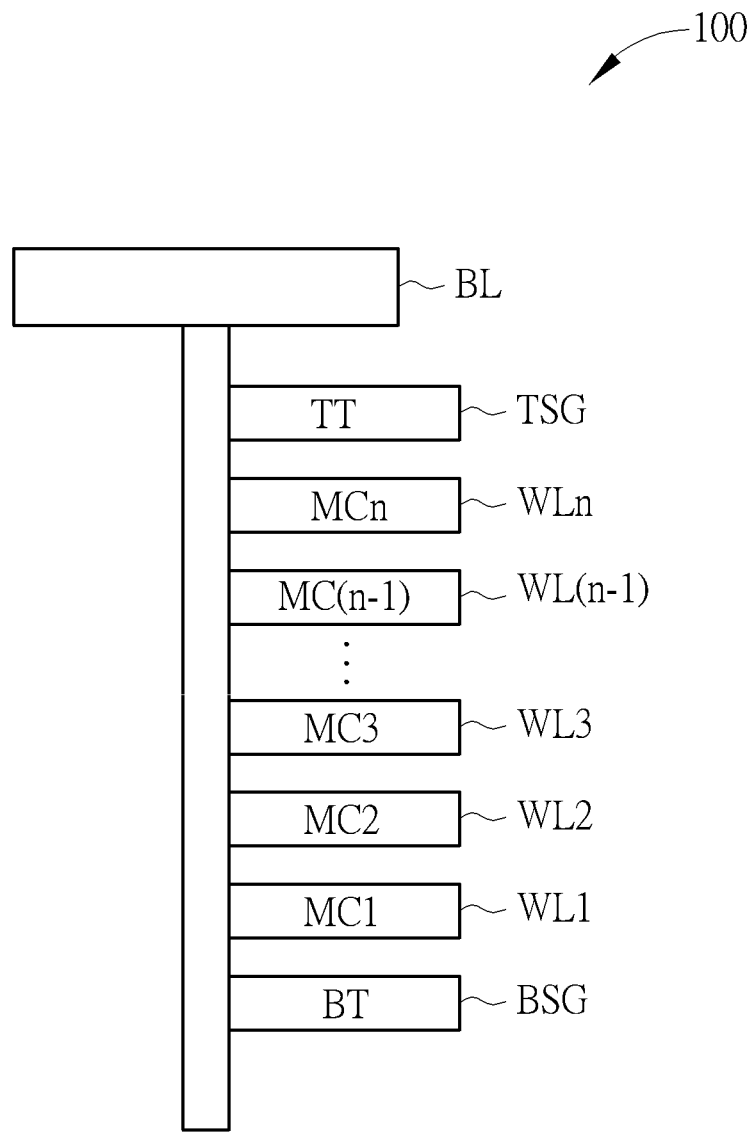
FIG. 2 is a schematic diagram illustrating a memory string of the memory array shown in FIG. 1 and related connection lines according to an embodiment of the present invention.

FIG. 2 is a schematic diagram illustrating a memory string 100 of the memory array 10 shown in FIG. 1 and related connection lines according to an embodiment of the present invention. The memory string 100 of the memory array 10 includes, but not limited thereto, a top select gate transistor TT, memory cells MC1 to MCn and a bottom select gate transistor BT. A bit line BL is coupled to the memory string 100. A top select gate line TSG is connected to the top select gate transistor TT of the memory string 100. The memory cells MC1 to MCn are connected in series with the top select gate transistor TT. Word lines WL1 to WLn are connected to the memory cells MC1 to MCn. Each of the word lines WL1 to WLn is separately connected to a memory cell of the memory cells MC1 to MCn. A bottom select gate line BSG is connected to the bottom select gate transistor BT. The memory string 100 may be connected to a source line via the bottom select gate transistor BT controlled by the bottom select gate line BSG and connected to associated bit line BL via the top select gate transistor TT controlled by the top select gate line TSG. The bit line BL may be disposed on the top of the memory string 100 in a direction perpendicular to the word lines WL1 to WLn and is connected to one or more sense amplifiers. Writing and erasing data in the memory cells MC1 to MCn can be controlled from the control circuits 20, 30 and external circuits through the connection lines of the non-volatile memory device 1. Note that, the number of the top select gate transistor, the memory cells, and the bottom select gate transistor may be not limited, and may be varied and designed in accordance with practical system demands and requirements.

During a programming operation period, when the memory string 100 of the memory array 10 is a selected memory string. The selected memory string 100 may be controlled by the selected bit line BL and the word lines WL1 to WLn. Among the memory cells MC1 to MCn of the selected memory string 100, a memory cell to be programmed, referred to as a selected memory cell, is controlled by the selected bit line BL and a selected word line of the word lines WL1 to WLn. In more detail, during a programming operation period, the control circuit 30 is configured to apply a selected bit line signal to a selected bit line of a selected memory string of the memory array 10 and apply an unselected bit line signal to unselected bit lines of unselected memory strings of the memory array 10. For the selected memory string 100, the control circuit 20 is configured to apply a program voltage signal to a selected word line connected to a selected memory cell of memory cells MC1 to MCn during the programming operation period. The program voltage signal is decreasing or changes in a descending step pulse manner during the programming operation period. For example, the program voltage signal applied to the selected word line decreases with time during the programming operation period. Moreover, the control circuit 20 is configured to apply a pass voltage signal to at least one of unselected word lines connected to unselected memory cells of the memory cells MC1 to MCn during the programming operation period.

Figure 3:
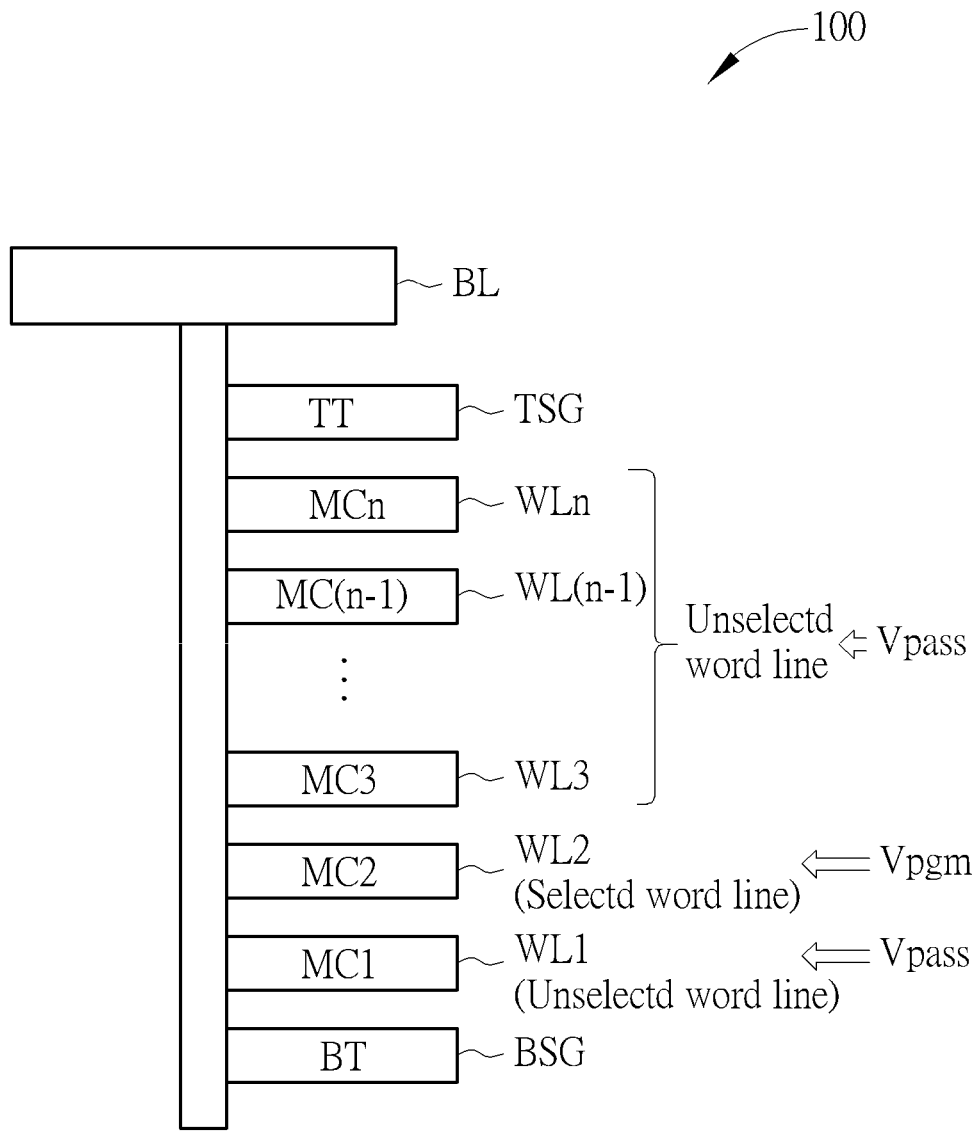
FIG. 3 is a schematic diagram illustrating selected word line and unselected word lines of the memory string shown in FIG. 2 according to an embodiment of the present invention.

Please refer to FIG. 3, which is a schematic diagram illustrating selected word line and unselected word lines of the memory string 100 shown in FIG. 2 according to an embodiment of the present invention. Suppose the memory cell MC2 connected to the word line WL2 is to be programmed. The memory cell MC2 connected to the word line WL2 is a selected memory cell and the word line WL2 is a selected word line. The memory cells MC1 and MC3 to MCn connected to the word lines WL1, WL3 to WLn are unselected memory cells. The word lines WL1, WL3 to WLn are unselected word lines. A program voltage signal Vpgm may be applied to the selected word line WL2 connected to the selected memory cell MC2 by the control circuit 20 during the programming operation period. A pass voltage signal Vpass may be applied to at least one of the unselected word lines WL1, WL3 to WLn during the programming operation period. For example, as shown in FIG. 3, the pass voltage signal Vpass may be applied to the unselected word lines WL1, WL3 to WLn.

Figure 4:
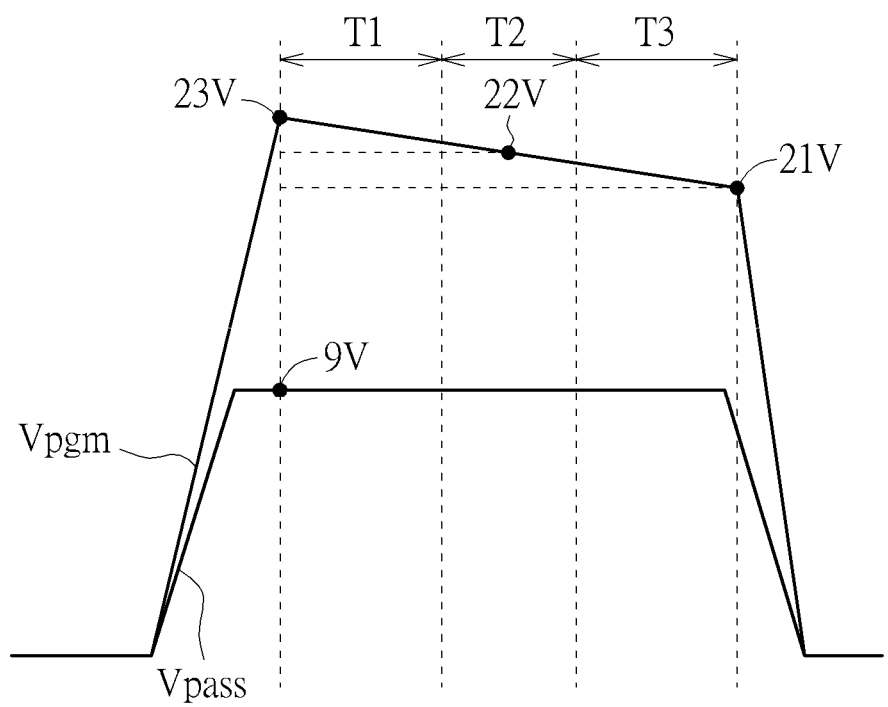
FIG. 4 and FIG. 5 are signal timing diagrams of the memory string shown in FIG. 3 according to embodiments of the present invention.

In an embodiment, a voltage level of the program voltage signal Vpgm in a first period of the programming operation period may be greater than a voltage level of the program voltage signal Vpgm in a second period subsequent to the first period of the programming operation period. For example, please further refer to FIG. 3 and FIG. 4. FIG. 4 is a signal timing diagram of the memory string 100 shown in FIG. 3 according to an embodiment of the present invention. Sequentially from the top of FIG. 4, the signal waveforms in a programming operation period are: a program voltage signal Vpgm and a pass voltage signal Vpass. As shown in FIG. 4, the program voltage signal Vpgm applied to the selected word line decreases with time during the programming operation period. The voltage level of the program voltage signal Vpgm changes in a descending ramp manner during time periods T1 to T3 of the programming operation period. For example, the voltage level of the program voltage signal Vpgm applied to the selected word line during the time period T1 is greater than the voltage level of the program voltage signal Vpgm applied to the selected word line during the time period T2. The voltage level of the program voltage signal Vpgm applied to the selected word line during the time period T1 is greater than the voltage level of the program voltage signal Vpgm applied to the selected word line during the time period T3. The voltage level of the program voltage signal Vpgm applied to the selected word line during the time period T2 is greater than the voltage level of the program voltage signal Vpgm applied to the selected word line during the time period T3.

Figure 5:
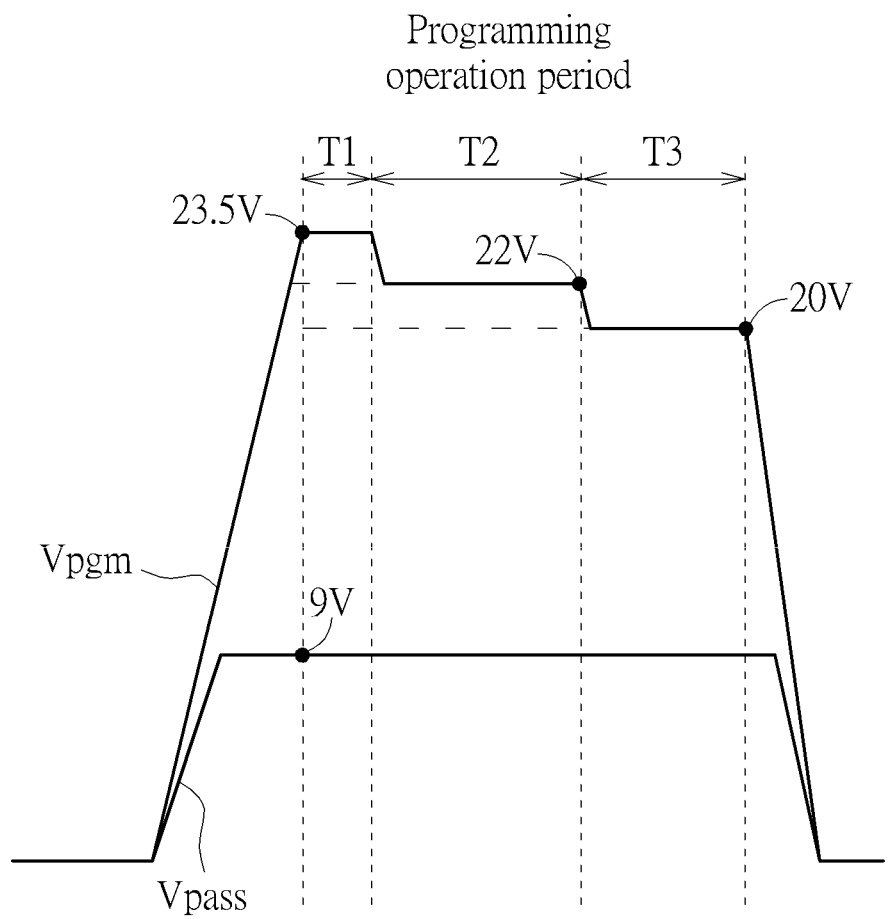

For example, please further refer to FIG. 3 and FIG. 5. FIG. 5 is a signal timing diagram of the memory string 100 shown in FIG. 3 according to an alternative embodiment of the present invention. Sequentially from the top of FIG. 5, the signal waveforms in a programming operation period are: a program voltage signal Vpgm and a pass voltage signal Vpass. Similarly, as shown in FIG. 5, the program voltage signal Vpgm applied to the selected word line decreases with time during the programming operation period. The voltage level of the program voltage signal Vpgm changes in a descending step pulse manner during time periods T1 to T3 of the programming operation period. The voltage level of the program voltage signal Vpgm applied to the selected word line during the time period T1 is greater than the voltage levels of the program voltage signal Vpgm applied to the selected word line during the time periods T2 and T3. The voltage level of the program voltage signal Vpgm applied to the selected word line during the time period T2 is greater than the voltage level of the program voltage signal Vpgm applied to the selected word line during the time period T3.

In an embodiment, a voltage level of the program voltage signal Vpgm in a first period of the programming operation period is greater than a voltage level of the program voltage signal Vpgm in a second period subsequent to the first period of the programming operation period. Moreover, a voltage level of the program voltage signal Vpgm in the second period of the programming operation period is greater than a voltage level of the program voltage signal Vpgm in a third period subsequent to the second period of the programming operation period. Moreover, for the typical memory system architecture, a normal program voltage may be applied to the selected word line for programing during the programming operation period. In an embodiment, a voltage level of the program voltage signal Vpgm in the second period of the programming operation period may be set to be a normal program voltage. Under such a condition, the voltage level of the program voltage signal Vpgm in the first period of the programming operation period may be greater than the normal program voltage and the voltage level of the program voltage signal Vpgm in the third period of the programming operation period may be smaller than the normal program voltage since the voltage level of the program voltage signal Vpgm in the second period is set to be the normal program voltage.

For example, as shown in FIG. 4, the voltage level of the program voltage signal Vpgm applied to the selected word line during the time period T1 is greater than the voltage level of the program voltage signal Vpgm applied to the selected word line during the time period T2. The voltage level of the program voltage signal Vpgm applied to the selected word line during the time period T2 is greater than the voltage level of the program voltage signal Vpgm applied to the selected word line during the time period T3. Further, suppose the normal program voltage is 22 volts. As show in FIG. 4, the voltage level (22 volts) of the program voltage signal Vpgm at the middle of the time period T2 is applied. Therefore, during time period T1, the voltage level of the program voltage signal Vpgm is greater than the normal program voltage. As such, an over driving scheme is performed on the selected word line during time period T1, the programming speed is increased. Further, during time period T3, since the voltage level of the program voltage signal Vpgm is smaller than the normal program voltage, the voltage applied to the far end memory cells may drop slowly due to the parasitic resistance and capacitance effect, thus providing a compensation for the near end memory cells with overwritten and mitigating the overwritten effect of the near end memory cells.

For example, as shown in FIG. 5, the voltage level of the program voltage signal Vpgm applied to the selected word line during the time period T1 is greater than the voltage level of the program voltage signal Vpgm applied to the selected word line during the time period T2. The voltage level of the program voltage signal Vpgm applied to the selected word line during the time period T2 is greater than the voltage level of the program voltage signal Vpgm applied to the selected word line during the time period T3. Suppose the normal program voltage is 22 volts. As show in FIG. 5, the voltage level (23.5 volts) of the program voltage signal Vpgm in the time period T1 is applied. The voltage level (22 volts) of the program voltage signal Vpgm in the time period T2 is applied. The voltage level (20 volts) of the program voltage signal Vpgm in the time period T3 is applied. Therefore, an over driving scheme is performed on the selected word line during time period T1 and accordingly, the programming speed may be increased. Moreover, the voltage level of the program voltage signal Vpgm is smaller than the normal program voltage during time period T3 so as to provide a compensation for the near end memory cells with overwritten and mitigate the overwritten effect of the near end memory cells.

In an embodiment, a voltage level of the program voltage signal Vpgm is greater than a voltage level of the pass voltage signal Vpass. For example, as shown in FIG. 4 and FIG. 5, the voltage level of the program voltage signal Vpgm applied to the selected word line during the time periods T1 to T3 is greater than the voltage level (9 volts) of the pass voltage signal Vpass.

On the other hand, after the programming operation period, a verification process may be performed in a verification operation period. During the verification operation period, a verify voltage may be applied to the selected word line to verify the magnitude of the threshold voltage of each memory cell and determine whether it passes the verification.

In summary, the embodiments of the present invention provide different voltage levels of the program voltage signal to the selected word line during single programming operation period. The embodiments of the present invention may enable faster programming speed in the early period of the programming operation period and also provide a compensation for the near end memory cells with overwritten for mitigating the overwritten effect of the near end memory cells in the late period of the programming operation period.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A control method of a non-volatile memory device, the non-volatile memory device comprising a memory array comprising a plurality of memory strings, each memory string comprising a plurality of memory cells connected in series, the control method comprising:
    applying a pass voltage signal to a plurality of unselected word lines connected to unselected memory cells of the plurality of memory cells during a programming operation period; and
    applying a program voltage signal to a selected word line connected to a selected memory cell of the plurality of memory cells during the programming operation period, wherein the program voltage signal is decreasing or changes in a descending step pulse manner during the programming operation period comprising a first period, a second period and a third period occurring consecutively and a voltage level of the program voltage signal in the second period of the programming operation period is set to be a normal program voltage, wherein the step comprising:
        applying the program voltage signal having a voltage level greater than the normal program voltage to the selected word line in the first period for performing an over driving scheme on the selected word line;
        applying the program voltage signal set to the normal program voltage to the selected word line in the second period; and applying the program voltage signal having a voltage level smaller than the normal program voltage to the selected word line in the third period for providing compensation.

2. The control method of claim 1, wherein a voltage level of the program voltage signal is greater than a voltage level of the pass voltage signal.

3. The control method of claim 1, wherein the non-volatile memory device is an NAND flash memory.

4. A non-volatile memory device, comprising:
a memory array comprising a plurality of memory strings, each memory string comprising a plurality of memory cells connected in series;
a plurality of word lines connected to the plurality of memory cells of the each memory string of the plurality of memory strings, each word line connected to a respective memory cell; and
a control circuit configured to apply a pass voltage signal to unselected word lines of the plurality of word lines connected to unselected memory cells of the plurality of memory cells during a programming operation period and apply a program voltage signal to a selected word line of the plurality of word lines connected to a selected memory cell of the plurality of memory cells during the programming operation period, wherein the program voltage signal is decreasing or changes in a descending step pulse manner during the programming operation period comprising a first period, a second period and a third period occurring consecutively and a voltage level of the program voltage signal in the second period of the programming operation period is set to be a normal program voltage, wherein the control circuit is configured to apply the program voltage signal having a voltage level greater than the normal program voltage to the selected word line in the first period for performing an over driving scheme on the selected word line, apply the program voltage signal set to the normal program voltage to the selected word line in the second period, and apply the program voltage signal having a voltage level smaller than the normal program voltage to the selected word line in the third period for providing compensation.

5. The non-volatile memory device of claim 4, wherein a voltage level of the program voltage signal is greater than a voltage level of the pass voltage signal.

6. The non-volatile memory device of claim 4, wherein the non-volatile memory device is an NAND flash memory.

* * * * *